(12) United States Patent
Negishi et al.

(10) Patent No.: US 10,028,412 B2
(45) Date of Patent: Jul. 17, 2018

(54) ELECTRONIC CONTROL APPARATUS AND METHOD FOR CONNECTING SUBSTRATE OF ELECTRONIC CONTROL APPARATUS

(71) Applicant: HITACHI AUTOMOTIVE SYSTEMS, LTD., Hitachinaka-shi, Ibaraki (JP)

(72) Inventors: Yoshiyasu Negishi, Hitachinaka (JP); Yoshio Kawai, Hitachinaka (JP); Takayuki Fukuzawa, Ishioka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 14/772,504

(22) PCT Filed: Jan. 20, 2014

(86) PCT No.: PCT/JP2014/050985
§ 371 (c)(1),
(2) Date: Sep. 3, 2015

(87) PCT Pub. No.: WO2014/148085
PCT Pub. Date: Sep. 25, 2014

(65) Prior Publication Data
US 2016/0021789 A1  Jan. 21, 2016

(30) Foreign Application Priority Data
Mar. 21, 2013 (JP) ................................ 2013-058888

(51) Int. Cl.
*H05K 7/20* (2006.01)
*H01L 23/36* (2006.01)
(Continued)

(52) U.S. Cl.
CPC ..... *H05K 7/20436* (2013.01); *H01L 23/3675* (2013.01); *H01L 23/42* (2013.01);
(Continued)

(58) Field of Classification Search
CPC ........... H05K 7/20436; H05K 7/20454; H05K 7/20854; H01L 23/42; H01L 23/3675; H01L 2924/0002
See application file for complete search history.

(56) References Cited

U.S. PATENT DOCUMENTS

2006/0067055 A1* 3/2006 Heffner ................... H01L 21/56
361/704
2006/0171127 A1* 8/2006 Kadoya ............. B29C 45/14377
361/752
(Continued)

FOREIGN PATENT DOCUMENTS

JP       10-232404 A    9/1998
JP    2000-022312 A    1/2000
(Continued)

*Primary Examiner* — Adam B Dravininkas
(74) *Attorney, Agent, or Firm* — Foley & Lardner LLP

(57) ABSTRACT

In a configuration that a thermal grease is applied between a circuit board having an electronic component mounted thereon and a case body containing the board to thermally connect both by the thermal grease, the application has not been easy since the thermal grease is high in initial viscosity. A thermal grease is made of a material that has a viscosity not impeding applicability at the initial stage (before application), for example, a viscosity of about 50-400 (Pa·s), and that increases to about 600-3,000 (Pa·s) in viscosity after application.

4 Claims, 4 Drawing Sheets

(51) Int. Cl.
*H01L 23/42* (2006.01)
*H01L 23/367* (2006.01)

(52) U.S. Cl.
CPC ..... *H05K 7/20454* (2013.01); *H05K 7/20854* (2013.01); *H01L 2924/0002* (2013.01)

(56) References Cited

U.S. PATENT DOCUMENTS

| | | | | |
|---|---|---|---|---|
| 2006/0232942 | A1* | 10/2006 | Nakatsu | B60L 11/08 361/710 |
| 2007/0108326 | A1* | 5/2007 | Ho | C09K 5/14 241/101.8 |
| 2007/0284366 | A1* | 12/2007 | Ohta | H01L 23/373 219/553 |
| 2009/0214870 | A1* | 8/2009 | Morita | C08G 59/40 428/413 |
| 2009/0309116 | A1* | 12/2009 | Kato | C09K 11/7721 257/98 |
| 2011/0058342 | A1* | 3/2011 | Kawakita | H01L 23/3135 361/735 |
| 2011/0261535 | A1* | 10/2011 | Izutani | H01L 23/3737 361/708 |
| 2012/0320544 | A1* | 12/2012 | Ohhashi | H05K 5/0052 361/752 |

FOREIGN PATENT DOCUMENTS

| | | | |
|---|---|---|---|
| JP | 2001-168545 A | 6/2001 | |
| JP | 2003-082064 A | 3/2003 | |
| JP | 2004-031416 A | 1/2004 | |
| JP | 2004-107507 A | 4/2004 | |
| JP | 2006-086536 A * | 3/2006 | ............... H05K 7/20 |
| JP | 2008-174697 A | 7/2008 | |
| JP | 2009-221311 A | 10/2009 | |
| JP | 2010-109293 A | 5/2010 | |
| JP | 2010-225674 A | 10/2010 | |
| JP | 2012-004468 A | 1/2012 | |
| JP | 2013-010862 A | 1/2013 | |
| JP | 2013-030518 A | 2/2013 | |
| WO | WO 2012/146204 A1 | 11/2012 | |

* cited by examiner

ELECTRONIC CONTROL APPARATUS AND METHOD FOR CONNECTING SUBSTRATE OF ELECTRONIC CONTROL APPARATUS

TECHNICAL FIELD

The present invention relates to an electronic control apparatus loaded onto a vehicle, such as an engine control unit or a control unit for automatic transmission, which is equipped with a radiation structure which radiates heat generated from electronic components, such as semiconductor elements, to the outside of a case body, and a method for connecting a substrate of the electronic control apparatus.

BACKGROUND ART

In the inside of a case body of an electronic control apparatus loaded onto a vehicle, such as an engine control unit or a control unit for automatic transmission, a great number of heat-generating electronic components, such as processing units and semiconductor elements, are incorporated there, so internal temperature of the case body easily increases.

Accordingly, a radiation structure that heat generated from electronic components is radiated to the outside of a case body of the apparatus from its surface by transmitting the heat to the case body has been developed.

FIG. 8 is an explanatory drawing which shows the above radiation structure. A heat conductive material 104 lies between an electronic component 102 loaded onto a circuit board 101 and a case body 103. Heat generation from the electronic component 102 is transmitted to the case body 103 through the heat conductive material 104, and it is radiated to the outside of the case body 103 from its surface. As the above heat conductive material, a thermal grease has been used.

In case that an adhesive is used as the above heat conductive material, the adhesive becomes rubbery to raise its hardness, thereby rigidly bonding the electronic components to the base portion. For this reason, stress is generated in the electronic components or soldered portions, thereby causing a fear to generate an electrical malfunction.

As compared with the above adhesive, a thermal grease can maintain its viscosity after application, and thereby can restrain concentration of a stress at the electronic components or the soldered portions. (for example, Patent Publication 1)

PRIOR ART PUBLICATION

Patent Publication

Patent Publication 1: Japanese Patent Application Publication 2006-86536

SUMMARY OF THE INVENTION

Problems to be Solved by the Invention

However, in case that a thermal grease was used, there were problems described next.
(1) In general, a thermal grease has a high initial viscosity as a heat conductive material, such as alumina, is mixed therein to raise thermal conductivity. Therefore, in case of applying the thermal grease by discharging it from a nozzle by air pressure, etc., it is difficult to smoothly discharge the thermal grease from the nozzle, so clogging of the nozzle is caused easily. Because of this, it is unfit for an application operation with a use of application robot, etc.

Thus, there is also adopted a method in which a nozzle is connected by piping to a pail can (for example, a can having a capacity of 20 kg) containing a thermal grease, and then the thermal grease in the can is applied by discharging from the nozzle. Even in this case, it is necessary to use a thin and long pipe. Therefore, it has not been easy to discharge the thermal grease even if air pressure is raised.

Furthermore, in case of applying by using a cartridge (for example, a vessel having a capacity 330 mL) containing a thermal grease, as piping is not necessary, the thermal grease can be applied with a weak pressure as compared with a case that piping is necessary. However, as the inner capacity of the cartridge is small, in case of using a large quantity of the thermal grease, the cartridge must be changed frequently, so the operation is not efficient.

For the sake of improving the application property of a thermal grease and preventing it from losing its shape caused by thermal deformation or vibration, there has been developed a thermal grease which has a multi-layered structure of a low viscosity layer and a high viscosity layer, which is improved by the low viscosity layer in application property, and which is prevented by the high viscosity layer from losing its shape caused by thermal deformation or vibration. However, this also has a high cost.

(2) A thermal grease tends to lose shape or flow out of the electronic component 102 by thermal deformation or vibration. To prevent it from losing shape or flowing out, as shown in FIG. 8, the electronic component 102 can be prevented from losing shape or flowing out by surrounding the periphery of the thermal grease 104 with a frame 105. However, in case of surrounding the thermal grease 104 with the frame 105, heat radiating effect gets worse by expanding a clearance C between the electronic component 102 and the case body 103 as much as the height of the frame 105.

The present invention was made with the aim of providing an electronic control apparatus in which the problems of the above conventional examples are solved, and in which it is possible to improve application property and prevent losing shape or flowing out caused by thermal deformation or vibration, with a lower cost as compared with the above thermal grease having the multi-layered structure; and a method for connecting a substrate of the electronic control apparatus.

Means for Solving the Problems

In an electronic control apparatus including a configuration for thermally connecting a circuit board having an electronic component mounted thereon and a case body containing the board by using a heat conducting material having flexibility,
there was used as the heat conductive material a thermal grease that increased in viscosity after application than before application.

Advantageous Effect of the Invention

In the above thermal grease, as viscosity in the step of application was set to be lower than viscosity after application, thereby it gets easy to conduct the application operation. Therefore, the application operation with a use of an application apparatus or the above pail can, etc. becomes possible, and application workability can be improved.

Furthermore, in the heat conductive material, its viscosity increases after application, so losing shape or flowing out caused by thermal deformation or vibration can be restrained.

MODE FOR CARRYING OUT THE INVENTION

Hereinafter, embodiments of the present invention are explained while making reference to the drawings.

Figure 1:
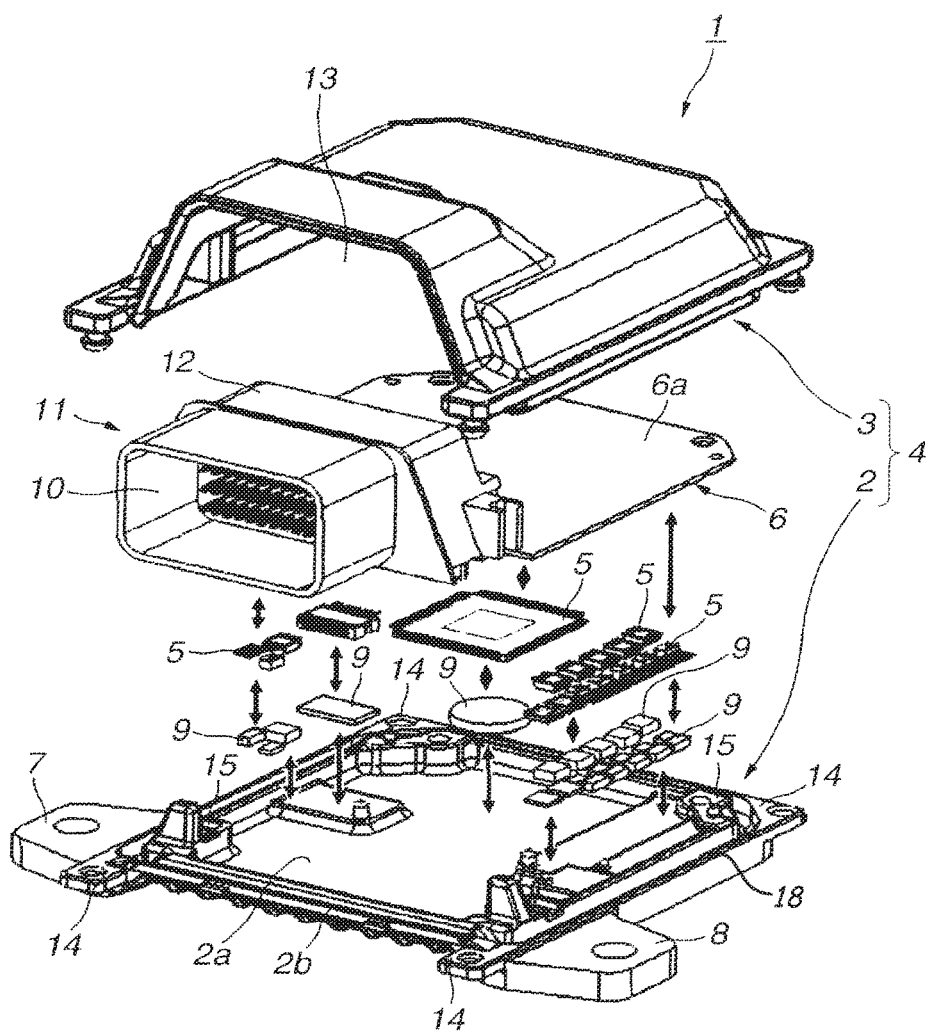
FIG. 1 An exploded perspective view of an electronic control apparatus.

FIG. 1 is an exploded perspective view of an engine control unit of an automobile as an electronic control apparatus 1. This electronic control apparatus 1 approximately comprises a case body 4 constituted by liquid-tightly connecting (connecting through a seal material 18) a plate-like case 2 fixed on the side of a car body with a box-like cover 3; and a circuit board 6 held in an internal protection space of this case body 4 and having various electronic components 5, such as heat generating electronic components and non-heat generating electronic components, mounted thereon. Furthermore, it is loaded in an engine room (not shown in the drawings), etc., and fixed to the side of a car body on the bottom surfaces of the brackets 7 and 8 of the case 2, which become fixing faces to the side of the car body.

A thermal grease 9 lies between the electronic components 5, specially heat generating electronic components, and the inner surface of the case 2.

Each component is explained concretely. The circuit board 6 is what is called a printed circuit board having an upper side surface (the surface on the side of the cover 3) on which there are mounted non-heat generating electronic components (not shown in the drawings) that generate comparatively no heat, such as condenser and coil, or require no particular heat radiation treatment, such as heat sink, and having a lower side surface (the surface on the side of the case 2) on which there are mounted heat generating electronic components 5 that comparatively easily generate heat, such as processing unit, transistor and IC. A wiring circuit pattern is formed, for example, on the front or back surface of a board made of a glass epoxy resin, etc. or in the inside of the board, and the various electronic components 5 are electrically connected to the wiring circuit pattern by solder, etc.

Furthermore, a connector 11 having a connecting port 10 to be connected to an external connector is attached to a part of a peripheral side of the circuit board 6. This connector 11 is on the circuit board 6 through an attaching base 12. In this connector 11, the connecting port 10 faces the outside through a window part 13 which is a space formed between the case 2 and the cover 3, and here, it is connected to a connector of a vehicle side.

The case 2 is monolithically formed to have a generally plate-like shape, more particularly, a shallow box-like shape whose periphery slightly stands up by using a metallic material having an excellent thermal conductivity such as aluminum. Specifically, side walls 2b are erected on the peripheral edge (each side edge) of a bottom wall 2a having an almost rectangular shape, and the whole of the case 2 is constituted so as to open upwardly. At the four corners of the side walls 2b, cover-fastening parts 14 to fix and fasten the cover 3 are formed, and the cover 3 is fixed on the cover-fastening parts 14. Furthermore, the circuit board 6 is screwed on the upper end surfaces of the board-fastening parts 15 erected on the peripheral portion on the inner wall surface side of the bottom wall 2a of the case 2.

Figure 2:
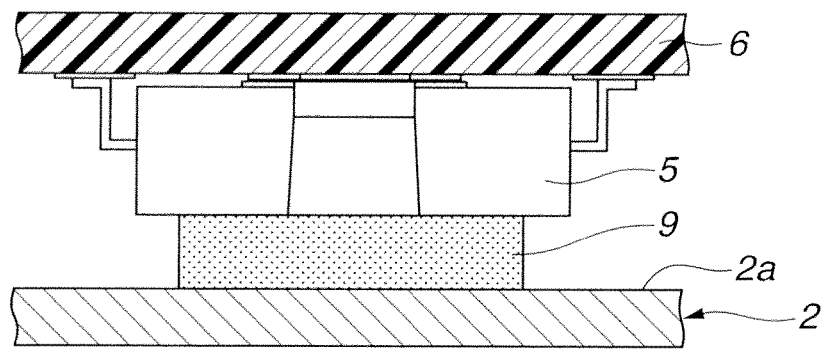
FIG. 2 A cross section of a principal part of the first embodiment.

FIG. 2 is a cross section showing a state that the thermal grease 9 lies between the heat generating electronic component 5 loaded onto the lower side surface of the circuit board 6 and the bottom wall 2a of the case 2. The thermal grease 9 efficiently transmits (conduct) heat generated from the heat generating electronic component 5 to the side of the case 2, and thereby makes the heat radiated from the outer surface of the case 2.

The thermal grease 9 has a viscosity at a level of not impeding application property at application, for example, a viscosity of approximately 50-400 Pa·s, and is made of a material whose viscosity finally increases to approximately 600-3000 Pa·s after curing.

It is preferable to properly use the viscosity of the thermal grease 9 at application in accordance with the purpose of use and the shape of the case body. One having a low viscosity (50 Pa·s and its vicinity) is suitable for a case of the thickness of the heat radiation clearance being little or a case of requiring a two-dimensional extent at application. One having a high viscosity (similar to 600 Pa·s and its vicinity) is suitable for a case of requiring the thickness of the heat radiation clearance and requiring a three-dimensional thickness, etc.

Actually, in the case of applying the thermal grease 9 by using an application apparatus, the application is conducted in many cases by limiting the grease to one type or several types. At that time, usually, a separate application apparatus is prepared according to the type of grease, and one having the right value is selected and used according to the whole application condition.

Furthermore, after curing, one having a low viscosity (600 Pa·s and its vicinity) is suitable for one having little thickness, a place having a small number of moving factors on condition that vibration or the like is little, one that is strong against pressing stress in terms of parts characteristics, etc. One having a high viscosity (similar to 3,000 Pa·s and its vicinity) is suitable for a case that thickness is needed or one having parts strong against pressing stress. (The condition for selecting the thermal grease is the same as above.)

Now, ways of considering stress resistance are as follows.
1. A component (chip component, etc.) directly soldered onto a substrate without a stress relaxation mechanism, such as IC lead, tends to be weak, and one (lead component, IC, etc.) soldered with a lead tends to be weak.
2. In a single element (it is not a soldered portion, but is a main body), one having a simple structure (a part such as resistor or condenser of a chip) tends to be strong, and one having a complicated structure (a part prepared by wire bonding in a mold resin, such as IC) tends to be weak. (1>2 is general as influence degree)

In the thermal grease 9, a thermal conductive silicone grease of a type of viscosity increase by addition reaction and a thermal conductive silicone grease of a type of viscosity increase by room temperature and humidity are known.

The thermal conductive silicone grease of a type of viscosity increase by addition reaction is one whose viscosity is increased by using a curing furnace, and requisite properties of grease can be obtained in a short time. On the other hand, as a curing furnace is needed, facility investment is needed. However, in case that the seal material 18, which is waterproof, is a thermosetting resin, the silicone grease can be cured by making use of heat in curing the seal material 18.

Furthermore, in the thermal conductive silicone grease of a type of viscosity increase by room temperature and humidity, facility investment can be kept down since a curing furnace is not necessary. On the other hand, a long time is required to obtain needed curing properties.

Figure 3:
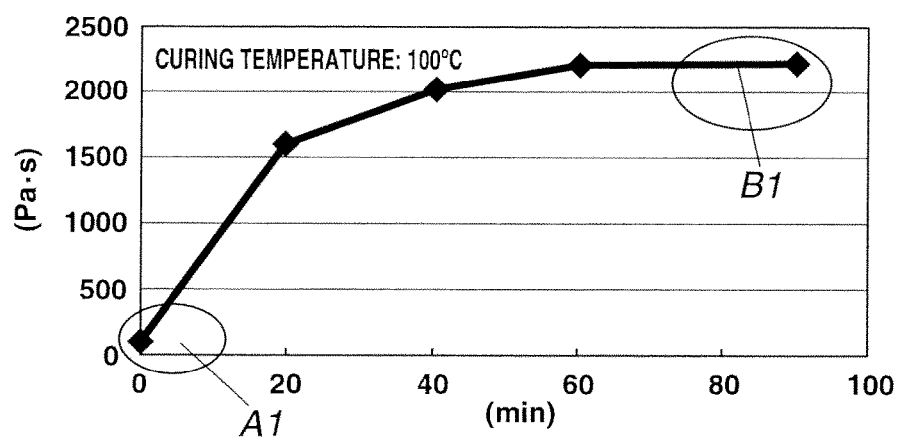
FIG. 3 A graph showing a curing characteristic of a thermal grease of a type of viscosity increase by addition reaction.

As shown in Table 1 and FIG. 3, regarding curing properties of the thermal conductive silicone grease of a type of viscosity increase by addition reaction, viscosity at a stage of 0 min right after application is 100 (Pa·s), at a stage of 20 min is 1,600 (Pa·s), at a stage of 40 min is 2,000 (Pa·s), at a stage of 60 min is 2,200 (Pa·s), and at a stage of 90 min is 2,200 (Pa·s). Furthermore, it is maintained at generally the same viscosity after the passage of 60 min.

TABLE 1

| <Curing property> Viscosity (Pa · s) | | | | |
|---|---|---|---|---|
| 0 min | 20 min | 40 min | 60 min | 90 min |
| 100 | 1,600 | 2,000 | 2,200 | 2,200 |

In the thermal conductive silicone grease of a type of viscosity increase by addition reaction, for the application in a mass-production facility, it is desirable that the initial viscosity is around 50-400 (Pa·s) surrounded by a circle A1 in FIG. 3. To restrain position displacement or flowing out of the grease, around 600-3,000 (Pa·s) surrounded by a circle B1 in FIG. 3 is desirable. However, there are various parameters besides viscosity, and a viscosity of 600-3,000 can be converted to around 10-200 (ASKER C) as hardness (ASKER C), or to around 5,000-200,000 MPa as modulus (G').

Figure 4:
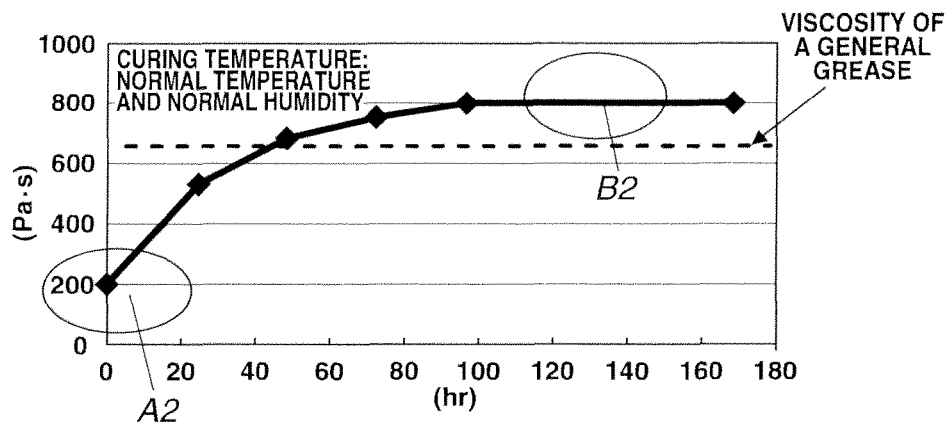
FIG. 4 A graph showing a curing characteristic of a thermal grease of a type of viscosity increase by room temperature and humidity.

Furthermore, as shown in Table 2 and FIG. 4, regarding curing properties of the thermal conductive silicone grease of a type of viscosity increase by room temperature and humidity, viscosity at a stage of 0 hr right after the application is 200 (Pa·s), at a stage of 24 hr is 530 (Pa·s), at a stage of 48 hr is 680 (Pa·s), at a stage of 72 hr is 750 (Pa·s), at a stage of 96 hr is 800 (Pa·s), and at a stage of 168 hr is 800 (Pa·s). Furthermore, it is maintained at generally the same viscosity after the passage of 96 hr.

TABLE 2

| <Curing property> Viscosity (Pa · s) | | | | | |
|---|---|---|---|---|---|
| 0 hr | 24 hr | 48 hr | 72 hr | 96 hr | 168 hr |
| 200 | 530 | 680 | 750 | 800 | 800 |

In the thermal conductive silicone grease of a type of viscosity increase by room temperature and humidity, for the application in a mass-production facility, it is desirable that the initial viscosity is around 50-400 (Pa·s) surrounded by a circle A2 in FIG. 4. To restrain the position displacement or flowing out of the grease, around 600-3,000 (Pa·s) surrounded by a circle B2 in FIG. 3 is desirable. As mentioned above, a viscosity of 600-3,000 can be converted to around 10-200 (ASKER C) as hardness (ASKER C), or to around 5,000-200,000 MPa as modulus (G').

To use either the thermal conductive silicone grease of a type of viscosity increase by addition reaction or that of a type of viscosity increase by room temperature and humidity, it is selected while taking account of performance required by a client (seismic resistance, operating temperature range, etc.), productivity, etc. For example, in case that a grease property such as high viscosity is required right after shipping an electronic control apparatus for automobile, the type of viscosity increase by addition reaction is used. In case that specification of seismic resistance can be satisfied even without a complete curing, the type of viscosity increase by room temperature and humidity is used.

If the thermal conductive silicone grease is adhered to the case body or a heat-generating member by mixing an adhesive assistant (a material to make an adhesion with adherend by hydrogen bond) like a silane coupling agent into the thermal conductive silicone grease to have an adhesive group, it is possible to suppress flowing out or deformation of the silicone grease caused by thermal deformation or vibration. Furthermore, as the mechanism of adhesion by hydrogen bond is well-known, its explanation is omitted.

Figure 5:
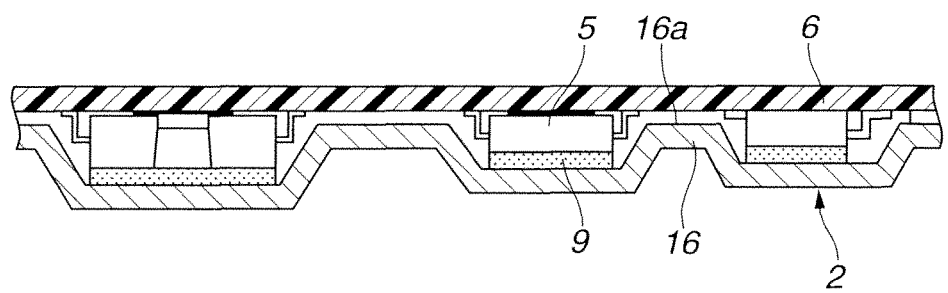
FIG. 5 A cross section of a principal part of the second embodiment.
Figure 6:
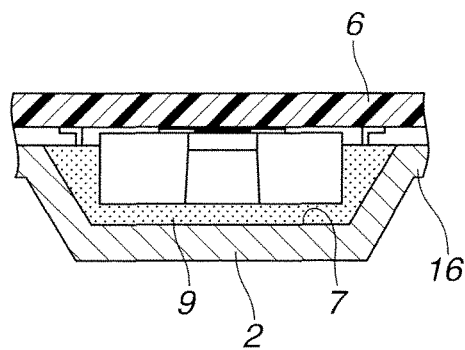
FIG. 6 A cross section of a principal part of the third embodiment.
Figure 7:
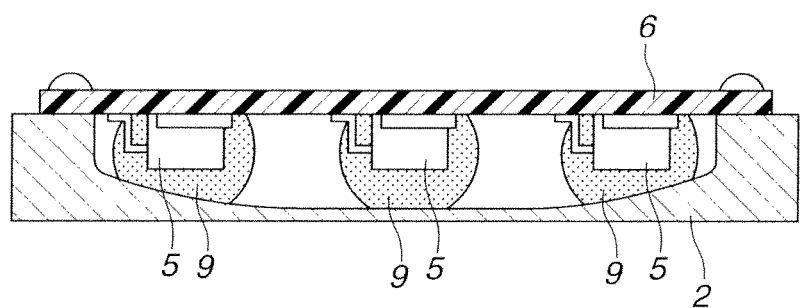
FIG. 7 A cross section of a principal part of the fourth embodiment.
Figure 8:
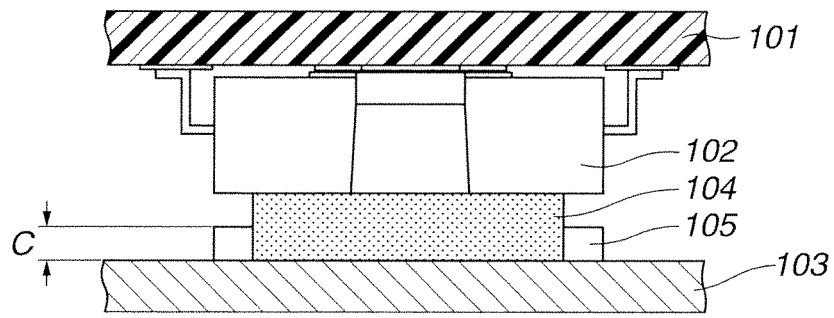
FIG. 8 An explanatory view of a conventional example.

FIG. 5 to FIG. 7 show the second to the fourth embodiments which have tried to further improve the heat radiating effect relative to the first embodiment shown in FIG. 2.

FIG. 5 shows the second embodiment. In this embodiment, a convex part 16 surrounding the heat-generating electronic component 5 was formed by projecting a part of a bottom wall of the case 2 toward the circuit board 6. The height of the above convex part 16 is formed according to the thickness of the heat-generating electronic component 5.

In the second embodiment, the capacity of the electronic control apparatus can be decreased by the existence of the convex part 16. Furthermore, as the end surface 16a of the convex part 16 gets close to the circuit board 6, it tends to easily receive thermal radiation from the circuit board 6. In addition, flowing out of the thermal grease 9 can be restrained by the convex part 16 surrounding the heat-generating electronic component 5.

FIG. 6 shows the third embodiment. It shows a case that the convex part 16 surrounding the heat-generating electronic component 5 is formed, and the thermal grease 9 is applied into a concave part 17 which adjoins the convex part 16 so as to fill the gap between the heat-generating electronic component 5 and the case 2. By such structure, it is possible by the thermal grease 9 to release heat generated by the heat-generating electronic component 5 from also the side surface of the heat-generating electronic component 5 to the side of the case 2. Furthermore, as the surface area of the case 2 is increased by the convex part 16 and the concave part 17, a further improvement of the heat radiating effect can be expected. As other structures are the same as those of the case of the second embodiment, overlapping explanations are omitted.

FIG. 7 shows the fourth embodiment. In this embodiment, it is tried to improve the heat radiating effect not only by narrowing the clearance between the circuit board 6 and the case 2 according to the displacement amount of the case 2 caused by the temperature rise or the increase of internal pressure in the inside of the case body 4, but also by the thermal grease 9.

Furthermore, in the above embodiments, heat-generating electronic components 5 which comparatively easily generate heat, such as processing unit, transistor, and IC, are fixed on the lower side surface of the circuit board 6, and the thermal grease 9 is made to lie between these heating electronic components 5 and the case 2 to form a structure releasing heat of the heat-generating electronic components 5 to the side of the case 2. On the contrary, it is possible to make a structure in which the heat-generating components 5 are fixed to the upper side surface of the circuit board 6, and in which the thermal grease 9 is made to lie between the heat-generating components 5 and the cover 3 to release heat of the heat-generating components 5 to the side of the case 2. In this case, the case 2 is made of a metallic material having an excellent thermal conductivity, such as aluminum. Furthermore, the heat may be radiated from both the case 2 and the cover 3 by separately fixing the heating electronic components 5 to both the upper side surface and the lower side surface of the circuit substrate 6.

EXPLANATION OF REFERENCES

1 . . . electronic control apparatus
2 . . . case
3 . . . cover
4 . . . case body
5 . . . electronic component
6 . . . circuit board
9 . . . thermal grease

The invention claimed is:

1. A method for producing an electronic control apparatus, the electronic control apparatus comprising:
    a circuit board having an electronic component mounted thereon;
    a case body including a case and a cover;
    a waterproof seal material to join the cover and the case; and
    a heat conductive material arranged at a position between an inner surface of the case or the cover and the electric component,
    wherein the method comprises providing, as the heat conductive material, a thermal grease that increases in viscosity by heat, and applying the thermal grease to at least one side of the inner surface of the case or the cover and the electric component so as to be arranged in the position; and
    wherein the waterproof seal material, which is formed of a thermosetting resin, is applied to a connecting position between the case and the cover, and after the thermal grease and the waterproof seal material are applied, the thermal grease and the waterproof seal material are heated at a state such that the circuit board is contained in the case body, thereby causing the thermal grease to increase in viscosity and curing the waterproof material.

2. The method for producing the electronic control apparatus as claimed in claim 1, wherein the thermal grease contains an adhesive assistant, and the thermal grease after heated is made to adhere to the electric component and the case body.

3. The method for producing the electronic control apparatus as claimed in claim 2, wherein a clearance between the case and the circuit board gets narrower toward a fixing part side of the circuit board.

4. The method for producing the electronic control apparatus as claimed in claim 1, wherein a clearance between the case and the circuit board gets narrower toward a fixing part side of the circuit board.

* * * * *